(12) United States Patent
Yuan

(10) Patent No.: US 12,445,121 B2
(45) Date of Patent: Oct. 14, 2025

(54) HIGH-SIDE CURRENT ACQUISITION AND SAFETY PROTECTION CIRCUIT OF A POWER ELECTRONIC SWITCH

(71) Applicant: HEFEI CHUANGYUAN VEHICLE CONTROL TECHNOLOGY CO., LTD, Anhui (CN)

(72) Inventor: Tinghua Yuan, Anhui (CN)

(73) Assignee: HEFEI CHUANGYUAN VEHICLE CONTROL TECHNOLOGY CO., LTD, Anhui (CN)

( * ) Notice: Subject to any disclaimer, the term of this patent is extended or adjusted under 35 U.S.C. 154(b) by 193 days.

(21) Appl. No.: 18/274,468

(22) PCT Filed: Jan. 28, 2022

(86) PCT No.: PCT/CN2022/074488
§ 371 (c)(1),
(2) Date: Sep. 11, 2023

(87) PCT Pub. No.: WO2022/161451
PCT Pub. Date: Aug. 4, 2022

(65) Prior Publication Data
US 2024/0128964 A1    Apr. 18, 2024

(30) Foreign Application Priority Data
Jan. 29, 2021  (CN) .......................... 202110130329.X

(51) Int. Cl.
*H03K 17/082* (2006.01)
(52) U.S. Cl.
CPC ..... *H03K 17/0822* (2013.01); *H03K 17/0828* (2013.01)

(58) Field of Classification Search
CPC ......... H03K 17/082–0828; H02H 3/08; H02H 3/087; H02H 9/02; H02H 9/025
See application file for complete search history.

(56) References Cited

U.S. PATENT DOCUMENTS 6,141,193 A      10/2000  Mercer
11,128,290 B2 *   9/2021  Aeloiza ................... H03K 5/24
(Continued)

FOREIGN PATENT DOCUMENTS

CN    201388158    1/2010
CN    202019301    10/2011

OTHER PUBLICATIONS

Translation of CN 201388158. Jan. 20, 2010. (Year: 2010).*
(Continued)

*Primary Examiner* — Thienvu V Tran
*Assistant Examiner* — Christopher J Clark
(74) *Attorney, Agent, or Firm* — JCIPRNET

(57) ABSTRACT

The present invention provides a high-side current acquisition and safety protection circuit of a power electronic switch, including a power electronic switch for driving a load, a power supply for providing power energy for the power electronic switch, a control module for sensing the current source signal contained in the power electronic switch and converting the sensed current source signal into a control signal for safety protection of the power electronic switch, and an isolated power source that provides working power for the control module, wherein the negative pole of the isolated power source is connected to the positive pole of the power supply. The invention has simple structure, reliable control, and low cost.

7 Claims, 3 Drawing Sheets

(56) References Cited

U.S. PATENT DOCUMENTS

2009/0179685 A1     7/2009   Yanagigawa et al.
2010/0265740 A1*   10/2010   Zargari ................ H02M 1/096
                                                                        363/17
2020/0194993 A1*   6/2020   Dickey .................... H02H 3/22

OTHER PUBLICATIONS

"International Search Report (Form PCT/ISA/210) of PCT/CN2022/074488," mailed on Apr. 13, 2022, with English translation thereof, pp. 1-4.

* cited by examiner

HIGH-SIDE CURRENT ACQUISITION AND SAFETY PROTECTION CIRCUIT OF A POWER ELECTRONIC SWITCH

CROSS-REFERENCE TO RELATED APPLICATION

This application is a 371 of international application of PCT application serial no. PCT/CN2022/074488, filed on Jan. 28, 2022, which claims the priority benefit of China application no. 202110130329.X, filed on Jan. 29, 2021. The entirety of each of the above mentioned patent applications is hereby incorporated by reference herein and made a part of this specification.

TECHNICAL FIELD

The invention relates to the technical field of on-state current detection of a power electronic switch driven by a high side and safety protection of the power electronic switch, in particular to a high-side current acquisition and safety protection circuit of a power electronic switch.

RELATED ART

The current detection methods of power electronic switches driven by high side mainly include three sensor forms of current loop, Hall device and integrated circuit. A current sensor in the form of a current loop or a Hall device is bulky, while a current sensor in the form of an integrated circuit is expensive.

At present, to reduce costs, a detection resistor is usually placed at the high position between the positive electrode of the power source voltage and the power electronic switch, and then the signal is amplified by the operational amplifier to realize current detection. However, since the common-mode voltage of the detecting amplifier is close to the power source voltage, this wide range of common-mode voltage requires the operational amplifier to have a high common-mode characteristic, which will in turn lead to increased costs.

Therefore, for occasions where many power electronic switches are used, such as automobiles, it is particularly important to reduce the current detection and protection costs of the power electronic switches.

SUMMARY OF INVENTION

The purpose of the present invention is to provide a current acquisition circuit and a safety protection circuit of a high-side power electronic switch with simple structure and relatively low cost.

To achieve the above object, the present invention adopts the following technical solutions:

A high-side current acquisition and safety protection circuit of a power electronic switch, comprising
  a power electronic switch for driving a load;
  a power supply for providing power energy to the power electronic switch;
  a control module for sensing the current source signal contained in the power electronic switch and converting the sensed current source signal into a control signal for safety protection of the power electronic switch;
  an isolated power source for providing working power to the control module, and the negative electrode of the isolated power source is connected to the positive electrode of the power supply.

Further, an input terminal of the power electronic switch is connected to the power supply VP, and an output terminal is connected to a load, wherein the power electronic switch includes an insulated gate MOSFET and an IGBT.

Further, the control module comprises a logic control unit, a signal conditioning unit for transforming the current source signal of the power electronic switch, and a drive conditioning unit for transforming the safety protection control signal input by the logic control unit.

Further, the signal conditioning unit includes a resistor R2, a resistor R3 and a reference power source VW. An end of the resistor R2 is connected to a source of the power electronic switch, and the other end is connected to an end of the resistor R3. The other end of the resistor R3 is connected to the reference power source VW. The reference power supply VW is an independent power source or a voltage source output by a D/A converter in the logic control unit.

Further, the signal conditioning unit comprises a resistor R4, a resistor R5, a resistor R6, and an operational amplifier OP, wherein an end of the resistor R4 is connected to a drain of the power electronic switch, and the other end is connected to a positive electrode of the operational amplifier OP. An end of the resistor R5 is connected to a source of the power electronic switch, and the other end is connected to a negative electrode of the operational amplifier OP. An end of the resistor R6 is connected to the negative electrode of the operational amplifier OP, and the other end is connected to an output terminal of the operational amplifier OP.

Further, an output port IO-1 of the logic control unit is connected to a command input port CIN of the drive conditioning unit. An output port OUT of the drive conditioning unit is connected to a control terminal TG of the power electronic switch 1, wherein the control terminal TG is connected to a gate of the power electronic switch through a resistor R1, wherein an input signal of an input port CIN of the drive conditioning unit is a logic level signal. An output signal of the output port OUT of the drive conditioning unit is a level signal for driving the power electronic switch, and the level signal is used to control the conduction of the MOSFET in the power electronic switch.

Further, the logic control unit comprises an A/D converter, a digital logic comparator and a digital threshold level unit, wherein an input of the A/D converter is an output of the signal conditioning unit. The logic control unit is used to protect the power electronic switch. A first input terminal of the digital logic comparator is connected to an output conversion result of the A/D converter. A second input terminal is connected to the configurable digital threshold level unit, and an output of the digital logic comparator is connected to the input terminal CIN of the drive conditioning unit. wherein the digital logic comparator comprises a virtual digital logic comparator realized by operation logic or a digital logic comparator configured by software.

Further, the logic control unit also comprises a logic analog comparator. A first input terminal of the analog logic comparator is connected to an output terminal of the signal conditioning circuit. A second input terminal is connected to a configurable analog threshold level, and an output of the analog logic comparator is connected to an input terminal CIN of the drive conditioning unit.

Further, outputs of the digital logic comparator and the analog logic comparator are all connected to the output terminal IO-1 of the logic control unit, and the logic control unit performs logic AND operation on the outputs of the digital logic comparator and the analog logic comparator, and then outputs to the input terminal CIN of the drive conditioning unit.

Further, the isolated power source comprises a DC/DC isolated power source. The negative electrode of the isolated power source is connected to the positive electrode of the power supply through at least one diode.

Effects of Invention (1) The current sensing signal source in the present invention is obtained from the on-state internal resistance of the power electronic switch itself, which saves an additional sensor, reduces the volume and the cost.

(2) The connection manner of the isolated power source and the power supply in the present invention provides a safe power source for driving the conduction work and safety protection of the MOSFET, and improves the reliability of the power electronic switch.

(3) The present invention effectively combines the control module, isolated power source and power electronic switch into an intelligent electronic switch assembly with safety protection and current detection. The logic control unit and current source signal conditioning circuit have simple structure and short logic circuit, and is easy to implement.

(4) The present invention upgrades the ordinary electronic switch to an intelligent electronic switch with safety protection and current detection, which has simple structure, reliable operation, low cost, and wide application. The present invention provides a high-side current acquisition and safety control circuit of a power electronic switch with simple structure and low performance requirements, thereby reducing the volume and cost of the system constructed by the present invention while ensuring reliable performance.

Reference Signs List: 1. power electronic switch; 2. load; 3. control module; 31. logic control unit; 32. signal conditioning unit; 33. drive conditioning unit; 4. isolated power source

DESCRIPTION OF EMBODIMENTS

A preferred embodiment of the present invention will be described in detail below in conjunction with the accompanying drawings.

Figure 1:
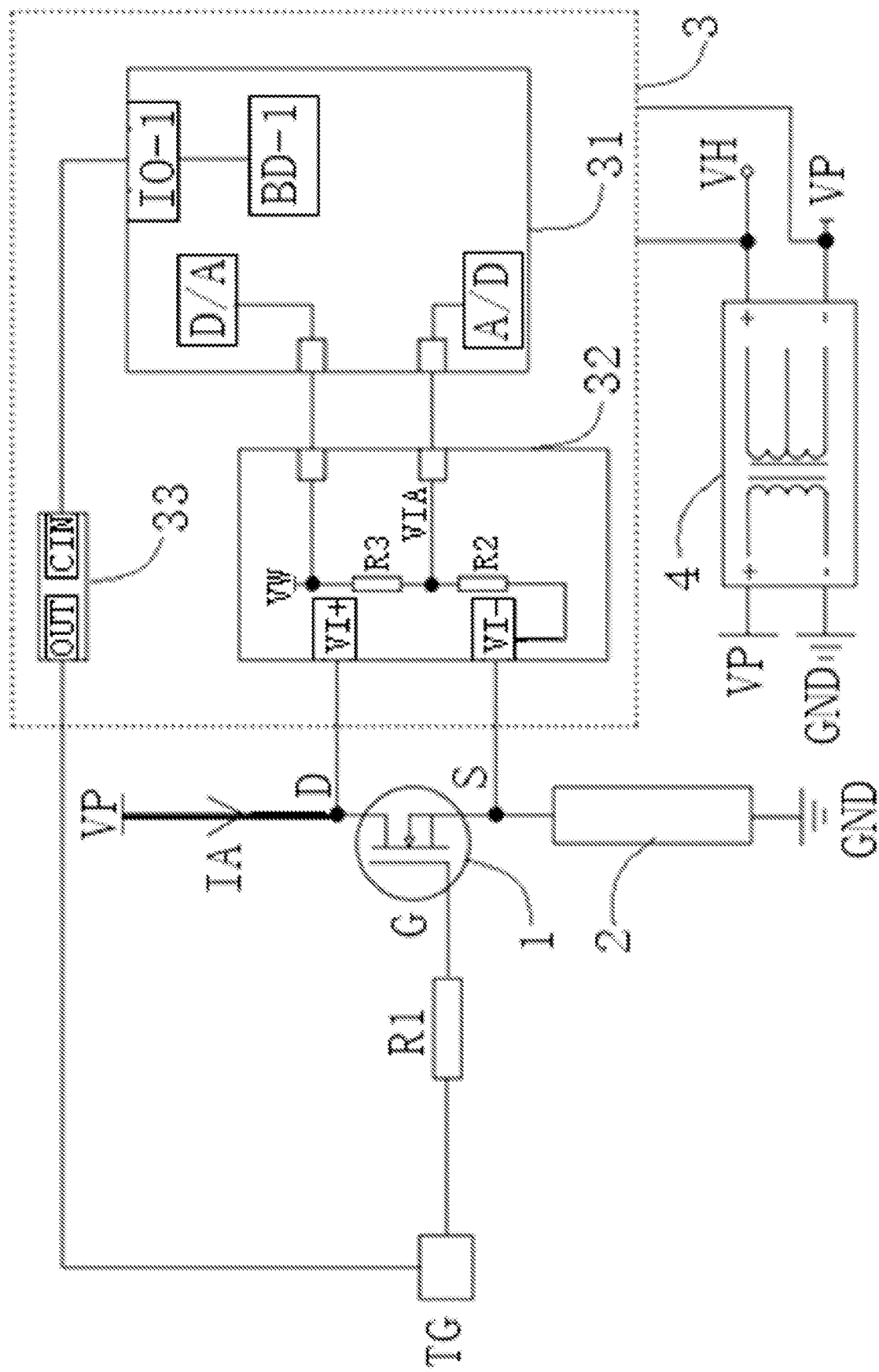
FIG. 1 is a schematic diagram of a circuit principle of Embodiment 1 of the present invention.

The high-side current acquisition and safety protection circuit of a power electronic switch as shown in FIG. 1 includes a power electronic switch 1 for driving a load 2, a power supply for providing power energy for the power electronic switch, and a control module 3 for sensing the current source signal contained in the power electronic switch and converting the sensed current source signal into a control signal for safety protection of the power electronic switch, and an isolated power source 4 that provides working power for the control module.

The power supply input terminal of the power electronic switch 1 described in this preferred embodiment is connected to the power supply VP, the output terminal is connected to the load 2, and the other end of the load is connected to the ground of the power supply. The power electronic switch 1 includes an insulated gate MOSFET and an IGBT. The current sensing signal source in the present invention is obtained from the conduction internal resistance of the power electronic switch 1 itself, which can save extra additional sensors. The isolated power source 4 includes a DC/DC isolated power source driven by the power supply, and the negative electrode of the isolated power source 4 is connected to the positive electrode of the power supply. In the present invention, the positive electrode of the power supply is set as the reference ground level of the control module 3, so that the signal conditioning circuit 32 and the logic control unit 31 become simple, and the requirements of the control system on circuit performance are reduced.

Specifically, the control module 3 includes a logic control unit 31, a signal conditioning unit 32 for transforming the current source signal of the power electronic switch to meet the sampling level signal requirements of the logic control unit A/D, and a drive conditioning unit 33 for transforming the safety protection control signal input by the logic control unit to meet the level signal requirements for driving the power electronic switch to be turned off or turned on. The logic control unit 31 includes a single-chip microcomputer, CPLD and FPGA.

The signal conditioning unit described in this preferred embodiment adopts the following solutions:

Embodiment 1

The signal conditioning unit 32 implemented as a bias resistor. As shown in FIG. 1, the power electronic switch 1 is an N-type MOSFET, the signal conditioning unit 32 includes a resistor R2, a resistor R3 and a reference power source VW. An end of the resistor R2 is connected to the source of the power electronic switch 1, and the other end is connected to an end of the resistor R3. The other end of the resistor R3 is connected to the reference power source VW. The reference power source VW is an independent power source or a voltage source output by the D/A converter in the logic control unit 31. The logic control unit 31 is provided with an A/D converter connected to the other end of the resistor R2 and a D/A converter connected to the other end of the resistor R3. The output port IO-1 of the logic control unit 31 is connected to the command input port CIN of the drive conditioning unit 33. The output port OUT of the drive conditioning unit 33 is connected to the control terminal TG, and the control terminal TG is connected to the gate of the power electronic switch 1 through the resistor R1. The input signal CIN of the drive conditioning unit 33 is a logic level signal, and the output signal OUT of the drive conditioning unit 33 is a level signal for driving the power electronic switch 1, and the level signal can control the turn-on and turn-off of the MOSFET.

The working principle of the high-side current acquisition of the power electronic switch is:

The on-state resistance between the drain and the source of the power electronic switch 1 is RON. When the power electronic switch 1 is turned on, the current IA generates a voltage difference signal VDS=IA*RON on its internal resistance. This voltage difference signal VDS is connected to the VI+ and VI− terminals of the signal conditioning unit 32 as the current source signal of the power electronic switch 1. Because the level of the source of the power electronic switch 1 is lower than the level of the drain, a negative level signal is presented to the A/D converter of the logic control unit 31, so a forward bias circuit is connected. The forward bias circuit consists of an independent voltage regulator VW, resistor R2 and resistor R3. The forward bias circuit makes the VDS voltage a positive level signal at the input terminal of the A/D converter. The formula for calculating the voltage at the junction of resistor R2 and resistor R3 is:

$$VIA=(R2*VW-R3*VI-)/(R2+R3).$$

In the specific implementation process, (R2*VW−R3*VI')>0 is selected.

The working principle of the high-side current safety protection of the above-mentioned power electronic switch is as follows:

The safety protection current threshold for the threshold unit VIG of the logic control unit 31 is set in advance (signs omitted in the figure). When the A/D sampling current value of the logic control unit 31 is greater than the set current threshold VIG by software comparison, the control port BD1 of the logic control unit 31 outputs a shutdown signal at the output port IO-1, and the shutdown signal is output by the OUT port after being transformed by the drive conditioning unit 33. By turning off the power electronic switch 1, the power electronic switch is protected.

At the same time, the A/D sampling current value can also be read and used by other external units or systems (specific circuit examples and descriptions omitted).

Embodiment 2

Figure 2:
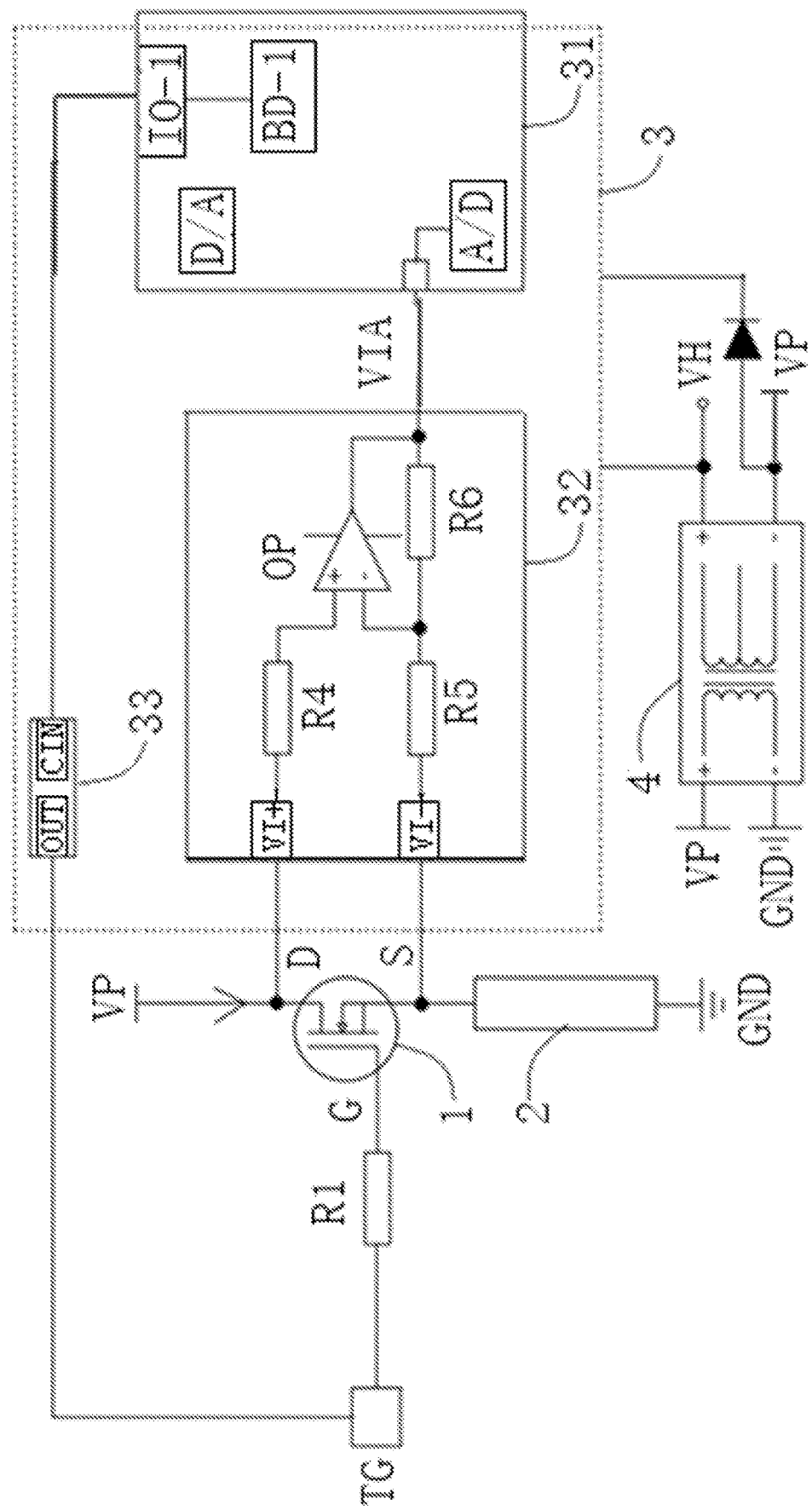
FIG. 2 is a schematic diagram of the circuit principle of Embodiment 2 of the present invention.

The signal conditioning unit 32 implemented as an operational amplifier. As shown in FIG. 2, the signal conditioning unit 32 includes a resistor R4, a resistor R5, a resistor R6 and an operational amplifier OP. An end of the resistor R4 is connected to the drain of the power electronic switch 1, and the other end is connected to the positive electrode of the operational amplifier OP. An end of the resistor R5 is connected to the source of the power electronic switch 1, and the other end is connected to the negative electrode of the operational amplifier OP. An end of the resistor R6 is connected to the negative electrode of the operational amplifier OP, and the other end is connected to the output terminal of the operational amplifier OP.

The working principle of the high-side current acquisition of the above-mentioned power electronic switch is:

The on-state resistance between the drain and the source of the power electronic switch 1 is RON. When the power electronic switch 1 is turned on, the current IA generates a voltage difference signal VDS=IA*RON on its internal resistance. This voltage difference signal VDS is connected to the VI+ and VI− terminals of the signal conditioning unit 32 as the current source signal of the power electronic switch 1. The signal conditioning unit 32 includes an operational amplifier OP, the output voltage of the operational amplifier OP is VIA, and the voltage calculation formula of the output voltage VIA is:

$$VIA=(VI+-VI-)*(R6/R5).$$

When the operational amplifier OP of the signal conditioning unit 32 is powered by a single power source, the negative signal received at its VI− input terminal distorts the amplified output. To make the signal at the VI− terminal positive, the negative output terminal VP of the isolated power source 4 is connected in series with one or more diodes and then connected to the positive electrode of the power supply VP. Because the on-state resistance of the power electronic switch 1 is generally several milliohms, the voltage formed by the load current on its internal resistance is generally lower than the forward on-state voltage of the diode (the forward on-state voltage of the diode is about 0.6V), and the ground level VPP of the control module 3 after connecting the diodes in series is lower than VP, so the signal received by the operational amplifier at the negative terminal is a positive signal.

The safety protection circuit and principle of this embodiment are the same as those of Embodiment 1.

Embodiment 3

Based on the Embodiment 2, an analog comparator is added to the logic control unit 31, and other parts are the same as Embodiment 2.

Figure 3:
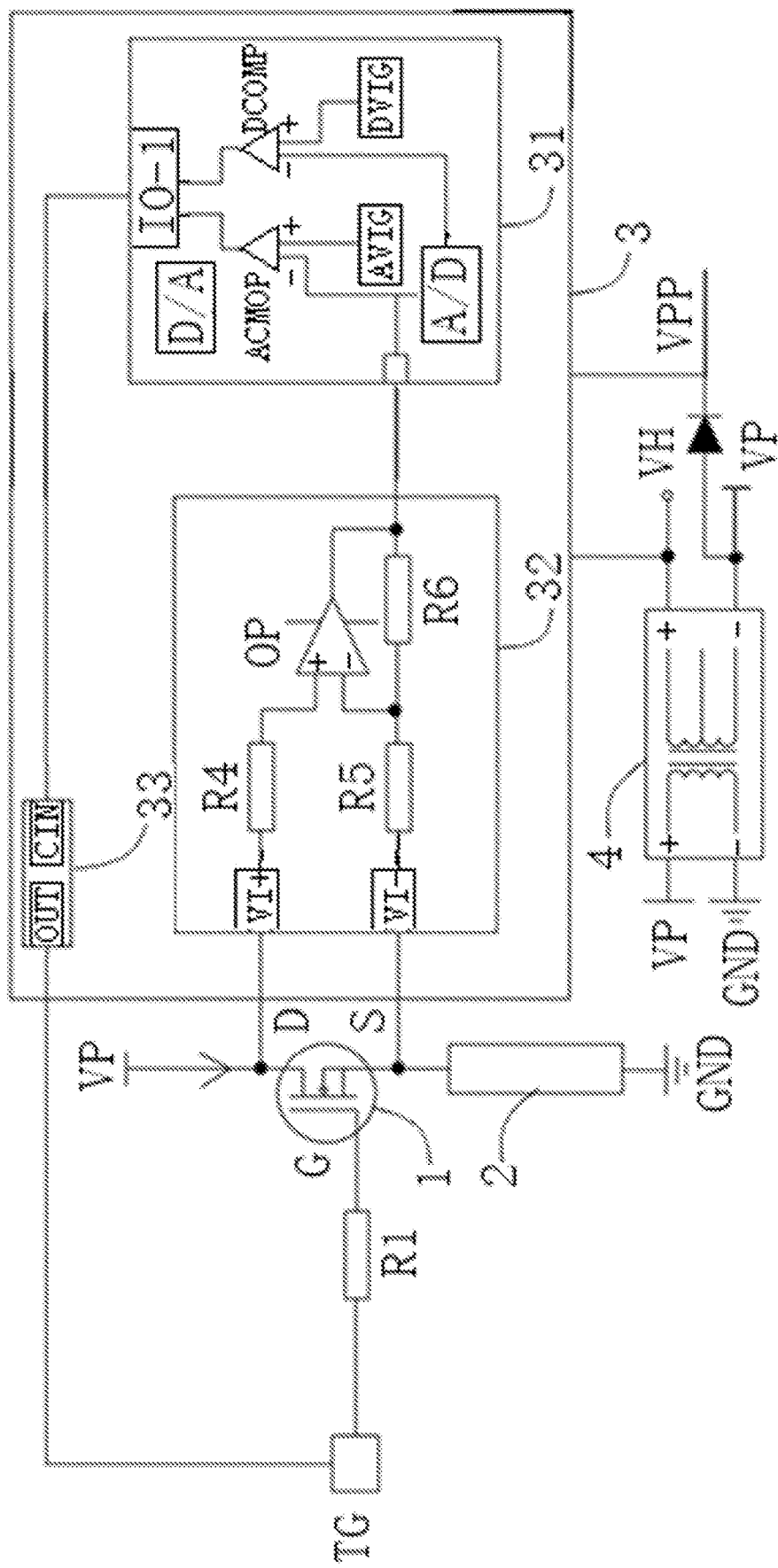
FIG. 3 is a schematic diagram of the circuit principle of Embodiment 3 of the present invention.

Specifically, as shown in FIG. 3, the logic control unit 31 includes an analog comparator ACOMP composed of discrete components and a digital comparator DCOMP configured by a digital logic unit. The negative terminal of the analog comparator is connected to the output terminal of the operational amplifier OP1, and the positive terminal is connected to the analog comparison threshold setting unit AVIG. The negative terminal of the digital comparator DCOMP is connected to the output terminal of the A/D converter, and the positive terminal is connected to the digital comparison threshold unit DVIG. The port IO-1 has a logical AND relationship with the output port of the analog comparator ACOMP and the output port of the digital comparator DCOM. That is, no matter which comparator outputs a logical shutdown signal, the port IO-1 outputs a logical shutdown signal. The input signal CIN of the drive conditioning unit is a logic level signal, and the output signal OUT of the drive unit is a level signal for driving the power electronic switch 1, and the level signal can turn off the conduction of the MOSFET.

The working principle of the current acquisition circuit of this embodiment is the same as that of Embodiment 2.

The working principle of the output shutdown logic signal of the analog comparator ACOMP is as follows: the logic control unit 31 pre-sets a current threshold for the threshold unit AVIG of the analog comparator ACOMP. When the level value VIA of the output terminal of the operational amplifier is greater than the set current threshold AVIG, the comparator ACOMP outputs a signal to turn off the power electronic switch 1.

The working principle of the digital comparator DCOM outputting the shutdown logic signal is as follows: the logic control unit 31 pre-sets a current threshold for the threshold unit DVIG of the digital comparator DCOMP. When the output of the A/D converter is greater than the set current threshold DVIG, the comparator DCOMP outputs a signal to turn off the power electronic switch 1.

Because the output of the digital comparator DCOMP is only controlled by software, the digital comparator DCOMP can be set with different output control logics.

In actual application, it can be set as follows: when the current flowing through the load is greater than the set current threshold DVIG, and the electronic switch needs to be protected, it can be set to two steps:

(1) The level signal VIA loaded to the negative terminal of the analog comparator ACOMP makes the analog comparator ACOMP output a shutdown signal.

(2) The control logic outputs the overload current value collected by the A/D converter to the negative terminal of the digital comparator DCOMP at the same time, so that the digital comparator DCOMP outputs a shutdown signal.

Because the output port IO-1 is in a logical AND relationship with the two comparators, any shutdown signal will cause the logic output port IO-1 to output a shutdown signal to the input port CIN of the drive conditioning unit 33, so that the power electronic switch 1 is turned off. Since the digital comparator DCOMP is controlled by software, the software logic is set to: once the digital comparator DCOMP outputs a shutdown signal, this shutdown logic is maintained. That is, no matter how the value loaded to the input port by the A/D converter changes, the power electronic switch 1 is not turned on until the logic control unit 31 receives other external signals to turn on the power electronic switch.

The above-mentioned embodiments are only descriptions of the preferred embodiments of the present invention, and are not intended to limit the scope of the present invention. Various modifications and improvements made by those skilled in the art to the technical solution of the present invention shall fall within the scope of protection determined by the claims of the present invention.

What is claimed is:

1. A high-side current acquisition and safety protection circuit of a power electronic switch, comprises:
    a power electronic switch (1) for driving a load (2);
    a power supply (VP) for providing power energy to the power electronic switch;
    a control module (3) for sensing a current source signal contained in the power electronic switch, and converting the sensed current source signal into a control signal for safety protection of the power electronic switch; and
    an isolated power source (4) for providing working power to the control module, and a negative electrode of the isolated power source is connected to a positive electrode of the power supply (VP),
    wherein an input terminal of the power electronic switch (1) is connected to the power supply (VP), and an output terminal is connected to a load, wherein the power electronic switch (1) comprises an insulated gate MOSFET,
    wherein the control module (3) comprises a logic control unit (31), a signal conditioning unit (32) for transforming the current source signal of the power electronic switch, and a drive conditioning unit (33) for transforming the control signal for safety protection input by the logic control unit, and
    wherein an output port (IO-1) of the logic control unit (31) is connected to a command input port CIN of the drive conditioning unit (33), and an output port (OUT) of the drive conditioning unit (33) is connected to a control terminal (TG) of the power electronic switch (1), wherein the control terminal (TG) is connected to a gate of the power electronic switch (1) through a first resistor (R1), wherein an input signal of the command input port (CIN) of the drive conditioning unit (33) is a logic level signal, wherein an output signal of the output port (OUT) of the drive conditioning unit (33) is a level signal for driving the power electronic switch, and the level signal is used to control the conduction of the MOSFET.

2. The high-side current acquisition and safety protection circuit of the power electronic switch according to claim 1, wherein the signal conditioning unit (32) comprises a second resistor (R2), a third resistor (R3) and a reference power source (VW), wherein an end of the second resistor (R2) is connected to a source of the power electronic switch, the other end of the second resistor (R2) is connected to an end of the third resistor (R3), and the other end of the third resistor (R3) is connected to the reference power source (VW), wherein the reference power source (VW) is an independent power source or a voltage source output by a D/A converter in the logic control unit.

3. The high-side current acquisition and safety protection circuit of the power electronic switch according to claim 1, wherein the signal conditioning unit (32) comprises a fourth resistor (R4), a fifth resistor (R5), a sixth resistor (R6), and an operational amplifier (OP), wherein an end of the fourth resistor (R4) is connected to a drain of the power electronic switch (1), and the other end of the fourth resistor (R4) is connected to a positive electrode of the operational amplifier (OP), wherein an end of the fifth resistor (R5) is connected to a source of the power electronic switch (1), the other end of the fifth resistor (R5) is connected to a negative electrode of the operational amplifier (OP), wherein an end of the sixth resistor (R6) is connected to the negative electrode of the operational amplifier (OP), and the other end of the sixth resistor (R6) is connected to an output terminal of the operational amplifier (OP).

4. The high-side current acquisition and safety protection circuit of the power electronic switch according to claim 1, wherein the logic control unit (31) comprises an A/D converter, a digital logic comparator and a digital threshold level unit, wherein an input of the A/D converter is an output of the signal conditioning unit (32), wherein the logic control unit (31) is used to protect the power electronic switch, wherein a first input terminal of the digital logic comparator is connected to an output conversion result of the A/D converter, and a second input terminal of the digital logic comparator is connected to the digital threshold level unit, wherein an output of the digital logic comparator is connected to the command input port (CIN) of the drive conditioning unit (33), wherein the digital logic comparator comprises a virtual digital logic comparator realized by operation logic or a digital logic comparator configured by software.

5. The high-side current acquisition and safety protection circuit of the power electronic switch according to claim 4, wherein the logic control unit (31) further comprises an analog logic comparator, wherein a first input terminal of the analog logic comparator is connected to an output terminal of the signal conditioning unit (32), and a second input terminal of the analog logic comparator is connected to a configurable analog threshold level, wherein an output of the analog logic comparator is connected to the command input port (CIN) of the drive conditioning unit (33).

6. The high-side current acquisition and safety protection circuit of the power electronic switch according to claim 5, wherein outputs of the digital logic comparator and the analog logic comparator are both connected to the output port (IO-1) of the logic control unit (31), and wherein the logic control unit (31) performs a logic AND operation on the outputs of the digital logic comparator and the analog logic comparator, and then outputs to the command input port (CIN) of the drive conditioning unit (33).

7. The high-side current acquisition and safety protection circuit of the power electronic switch according to claim 1, wherein the isolated power source (4) includes a DC/DC isolated power source, and the negative electrode of the isolated power source (4) is connected to a ground terminal of the control module through at least one diode.

* * * * *